United States Patent [19]
Choi

[11] Patent Number: 6,072,210
[45] Date of Patent: Jun. 6, 2000

[54] INTEGRATE DRAM CELL HAVING A DRAM CAPACITOR AND A TRANSISTOR

[75] Inventor: Seungmoo Choi, Orlando, Fla.

[73] Assignee: Lucent Technologies Inc., Murray Hill, N.J.

[21] Appl. No.: 09/220,418

[22] Filed: Dec. 24, 1998

[51] Int. Cl.[7] .......................... H01L 27/108; H01L 21/20
[52] U.S. Cl. .................. 257/303; 257/304; 257/306; 257/311; 438/253; 438/396
[58] Field of Search ....................... 438/197, 239, 438/240, 243, 244, 253, 258, 387, 396, 268, FOR 424, 238, 397, 254, 210; 257/71, 296, 298, 300, 288, 303, 306, 308, 341, 350, 401, 900, 901, 906, 908, 311, 304, 305, 309, 310

[56] References Cited

U.S. PATENT DOCUMENTS

| | | |
|---|---|---|
| 5,392,189 | 2/1995 | Fazan et al. ............................ 361/305 |
| 5,482,886 | 1/1996 | Park et al. . |
| 5,604,696 | 2/1997 | Takaishi ................................. 365/149 |
| 5,648,290 | 7/1997 | Yee . |
| 5,677,222 | 10/1997 | Tseng . |
| 5,792,690 | 8/1998 | Sung . |
| 5,801,079 | 9/1998 | Takaishi ................................. 438/396 |
| 5,858,831 | 1/1999 | Sung ..................................... 438/241 |
| 6,001,685 | 12/1999 | Kim ..................................... 438/253 |

*Primary Examiner*—Donald L. Monin, Jr.
*Assistant Examiner*—Hoai Pham

[57] ABSTRACT

An integrated DRAM cell comprises a DRAM capacitor and a transistor. The capacitor of the cell is formed in a first well in a dielectric layer overlying the cell transistor. The top electrode of the capacitor also serves as a barrier layer between an underlying plug in a second well in the dielectric layer. A method of forming the cell comprises the step of using a single mask for formation of the layer which acts as both the top electrode of the capacitor and the barrier layer of the second well.

6 Claims, 3 Drawing Sheets

INTEGRATE DRAM CELL HAVING A DRAM CAPACITOR AND A TRANSISTOR

BACKGROUND OF THE INVENTION

1. Field of the Invention

The present invention relates to dynamic random access memory (DRAW fabrication and devices, and more particularly to a method for forming a capacitor of a dynamic random access memory cell and the cell formed thereby.

2. Description of the Prior Art

In order to satisfy demands for high density DRAM semiconductor chips, micro-miniaturization employing sub-micron features are employed. However, to achieve high DRAM densities at low costs, new designs and technology integration are needed. Typically, a DRAM storage cell comprises a transistor and a capacitor wherein the gate of the transistor is controlled by a word line signal, and data represented by the logic level of the storage capacitor is written into or read out of the capacitor through a bit line signal.

One recent design and fabrication process for a DRAM cell is set forth in U.S. Pat. No. 5,792,960, incorporated herein by reference, wherein a polysilicon DRAM capacitor is vertically aligned with a polysilicon transistor gate structure while using an underlying bit line embedded in the device isolation insulator. Still other methods for fabricating DRAM capacitors and DRAM cells can be found with reference to U.S. Pat. Nos. 5,482,886; 5,648,290; 5,677,222; and 5,792,690, all of which are incorporated herein by reference. Present methods for achieving sub-micron features, such as stacked/trench capacitors for EDRAM cells, is believed to be overly complicated Generally, it is desirable to fabricate a DRAM cell having a high capacitance capacitor in order to maintain a high signal to noise ratio in reading the memory cell and to reduce "soft" errors (due to alpha particle interference). However, it is also desirable to achieve small feature size and to utilize a cost effective fabrication process. Since, for any given dielectric, the greater the capacitor area the greater the capacitance, one may compromise capacitance and cell size. However, rather than reduce capacitance, it would be desirable to use films having a higher dielectric constant so that size can be reduced without reducing total capacitance. Also, cost effective fabrication usually requires a minimum number of processing steps and mask registrations for the formation of the DRAM capacitor. Hence, it is desirable to reduce the number of masks used in processing and/or device size in an integrated logic-memory chip where processing for logic and memory are compatible.

SUMMARY OF THE INVENTION

A method is provided for forming a DRAM capacitor of a DRAM cell having a MOSFET that requires only one additional mask subsequent to formation of the MOSFET. The MOSFET is conventionally formed in and on a semiconductor substrate and the storage capacitor is formed in a trench provided in a top dielectric of the transistor, rather than in the adjoining silicon thus utilizing less substrate surface area. The method of the invention can reduce the DRAM cell to about 0.5 square microns in a technique that is compatible with forming both the memory and the processing devices on a single integrated substrate.

BRIEF DESCRIPTION OF THE DRAWINGS

FIG. 1 shows the transistor having conductive plugs therethrough and a dielectric top layer.

FIG. 2 shows a window etched into a portion of the top dielectric and partially overlying one of the conductive plugs.

FIG. 3 shows the results of depositing first a conductive layer and then a high dielectric constant layer over the surface of the device of FIG. 2.

FIG. 4 shows the device of FIG. 3 after etching another window through the deposited layers and the top dielectric of the transistor to the second conductive plug.

FIG. 5 shows the device of FIG. 4 after a second conductive layer is deposited thereover to form a capacitor structure in the first window area.

FIG. 6 shows the device of FIG. 5 after the formation of a conductive plug layer is formed to fill the previously formed trenches (windows).

FIG. 7 shows the device of FIG. 6 after removing the deposited layers back to the level of the top dielectric of the transistor.

FIG. 8 shows the device of FIG. 7 after deposition of a top electrode layer and a protective oxide layer over the previously formed capacitor and the conductive through-plug.

DETAILED DESCRIPTION OF THE PREFERRED EMBODIMENT

The invention will be described with reference to a portion of a DRAM cell showing the formation of a single DRAM capacitor in a dielectric layer overlying the gate electrode of the DRAMS field effect transistor (FET). The formation of the transistor for use in DRAM cells and integrated semiconductor processing and memory devices is well known in the art. For example, reference can be made to U.S. Pat. No. 5,648,290, incorporated herein by reference, which sets forth a process for forming such transistors.

Figure 1:
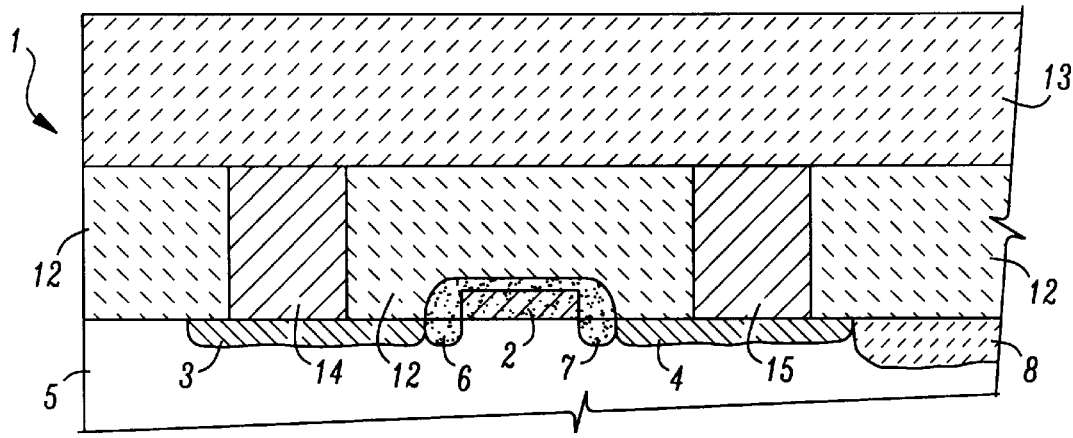
FIGS. 1 through 8 are side cross sectional views representing the sequence of steps involved in the method of forming a capacitor of a DRAM cell on the transistor of the cell.
Figure 2:
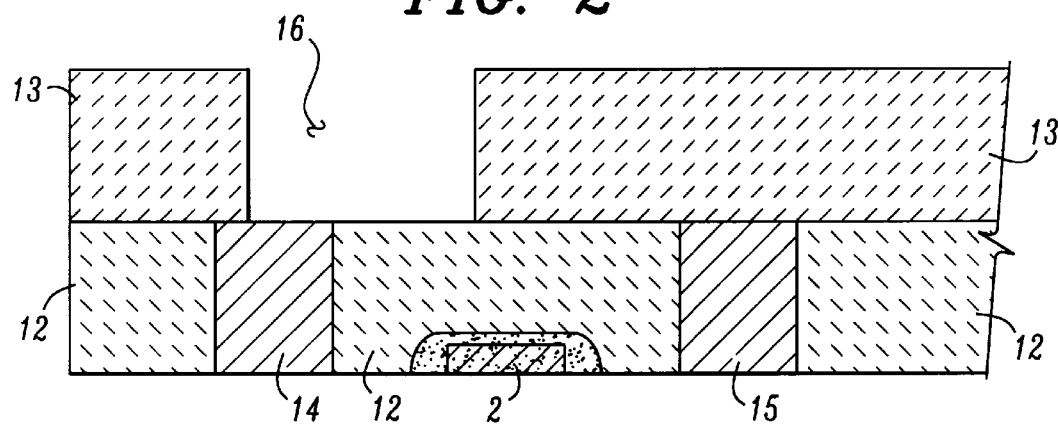

As can be seen with reference to FIG. 1, a typical DRAM cell n-type MOSFET comprises a gate electrode 2, and an n$^+$ source region 3 and an n$^+$ drain region 4 formed in a silicon substrate 5. The source and drain regions 3 and 4 are generally separated from the gate 2 by lightly doped n regions 6 and 7, respectively. A field oxide 8 is also provided, as shown. Also shown is a conformal dielectric layer 12 formed over the surface of the FET and a planarized top dielectric layer 13 over the conformal layer 12. Typically, the gate electrode is polysilicon or polycide, the conformal dielectric layer 12 is a high-density deposited silicon oxide and the top dielectric layer 13 is a chemical vapor deposited (CVD) silicon oxide layer. However, both dielectric layers 12 and 13 can be high-density plasma silicon oxides. In current processing techniques, high-density plasma silicon oxide is the most common choice for the back end dielectrics. This is because the high-density silicon oxide seems to offer the best results with respect to filling of narrow gaps and can be deposited at low temperature compared with CVD processing. Alternatively, dielectrics 12 and 13 may be a borophosphosilicate glass, a phosphosilicate glass, a glass formed from phosphorous and/or boron-doped tetraethyl orthosilicate, spin-on glass or other low dielectric constant films such as polymer, fluorinated oxide and hydrogen silsesquioxane. Also shown are conductive plugs, such as tungsten or copper plugs 14 and 15 which provide electrical through connections through the conformal dielectric layer 12 of the cell to the source 3 and drain 4.

In accordance with the present invention, conventional photolithographic techniques are used to define a trench or well area 16 which overlies at least a portion of the plug 14 and the conformal dielectric layer 12 adjacent the plug 14. The well is formed in the planarized dielectric layer 13 by etching through to the surface of the plug 14 and the adjacent conformal dielectric layer by conventional etching techniques.

Figure 3:
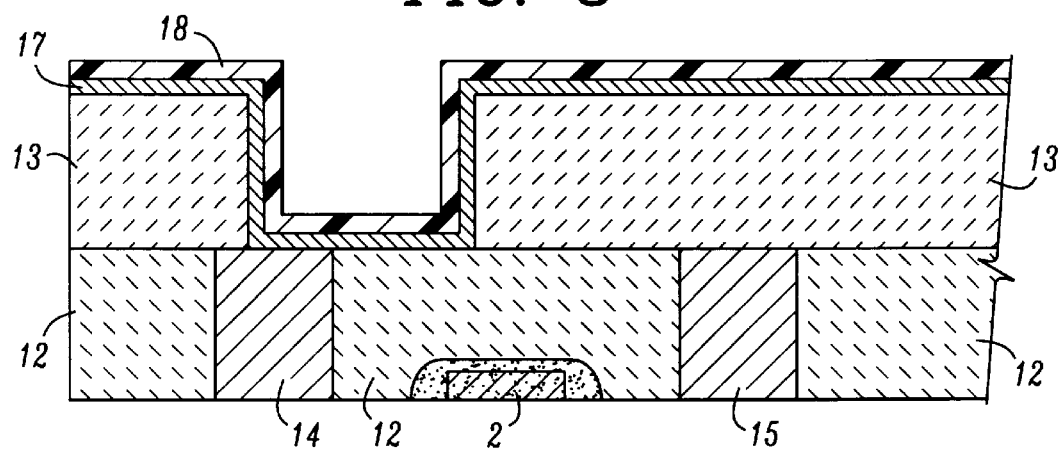
Figure 6:
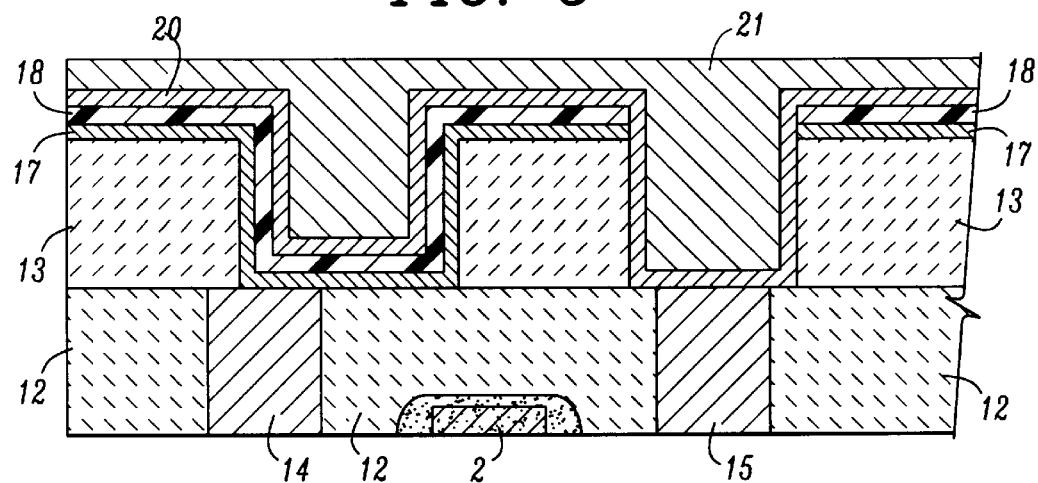
Figure 7:
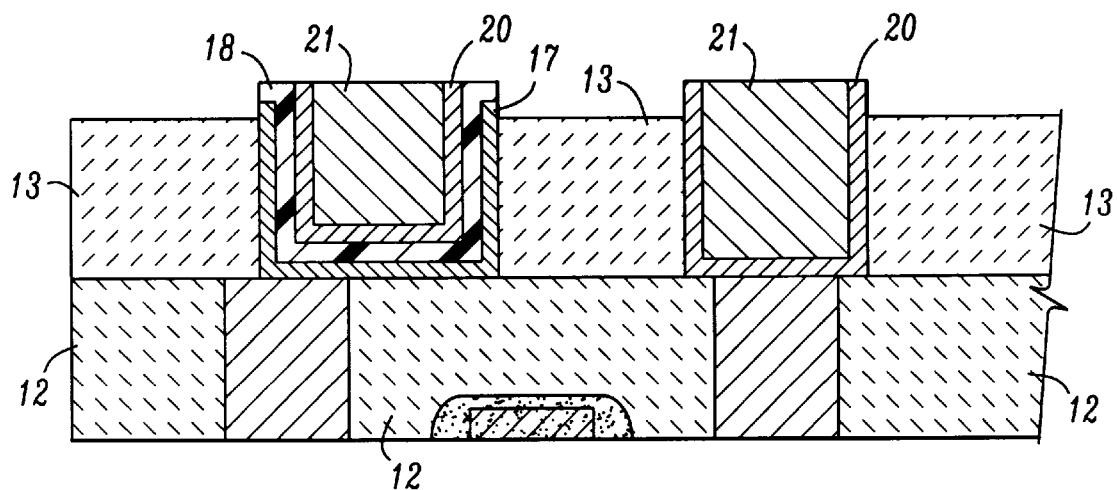
Figure 8:
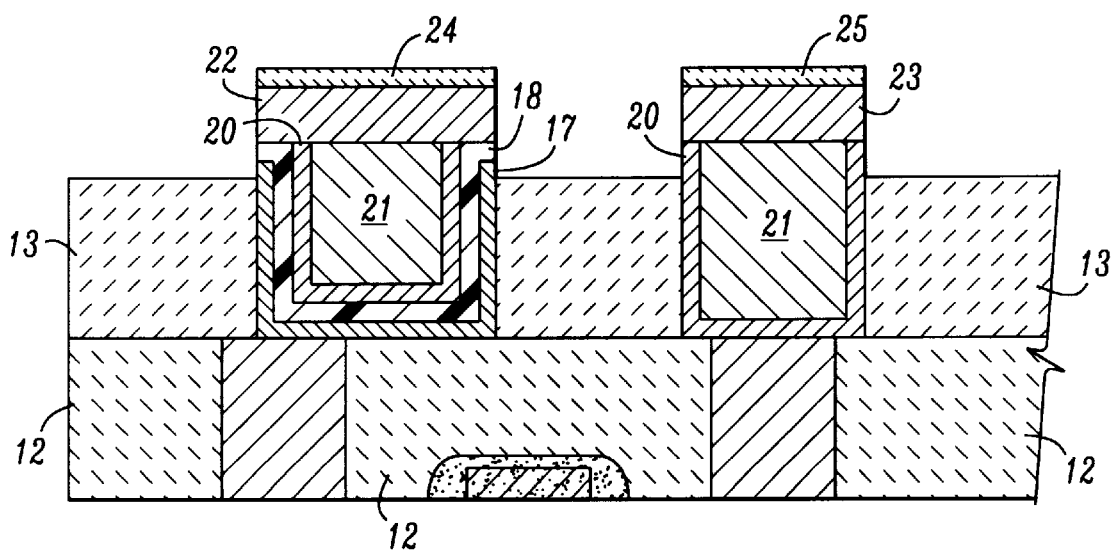

Thereafter, as shown in FIG. 3, a conductive electrode layer 17, preferably of a high work function material, is formed over the exposed surfaces of the device 1, including the walls of the trench 16. A high dielectric film 18 is then deposited over the conductive layer 17. While the term "high dielectric" generally refers to materials having a dielectric constant greater than that of silicon dioxide (≡3.9), for practical purposes in very high density (sub-micron) memory applications, the dielectric constant should be at least 20–30 and preferably significantly higher in order to achieve the required capacitance Examples of suitable capacitor dielectrics useful in the present invention include $Ta_2O_5$ and $(Ba,Sr)TiO_3$. The dielectric constants of films of these materials range from 30–40 and 1000–2000, respectively. The material used for the electrode layer 17 should be compatible with the dielectric material so as not to interact with it to form a series resistance at the interface of the two layers. Generally, metals with a high work function (e.g. Ag, Cu, Au); refractory metals or their suicides (e.g. W, V, Pt, Pd, Ni, Ti, Mo, Ta, Co, or their suicides); nitrides (e.g. Ti and Al nitrides); and conductive oxides (e.g. $RuO2$, $IrO2$, $SrRuO3$) are useful as electrode materials. However, in order to be compatible with present manufacturing techniques and to minimize the number of masks required, the top electrode 20 which is deposited when hereinafter indicated, also serves as a barrier material to the plug 21 (See FIGS. 6–8). For the bottom electrode, it is believed that Pt, $Pt Si_2$, Ni, $NiSi_2$ and Cu would be preferred as they should offer good contact to the high dielectric constant film.

It should be noted that the mask employed to define the trench 16, is the only "extra" mask required to form the DRAM capacitor of the DRAM cell in addition to the other masks normally required for fabrication of the cell.

Figure 4:
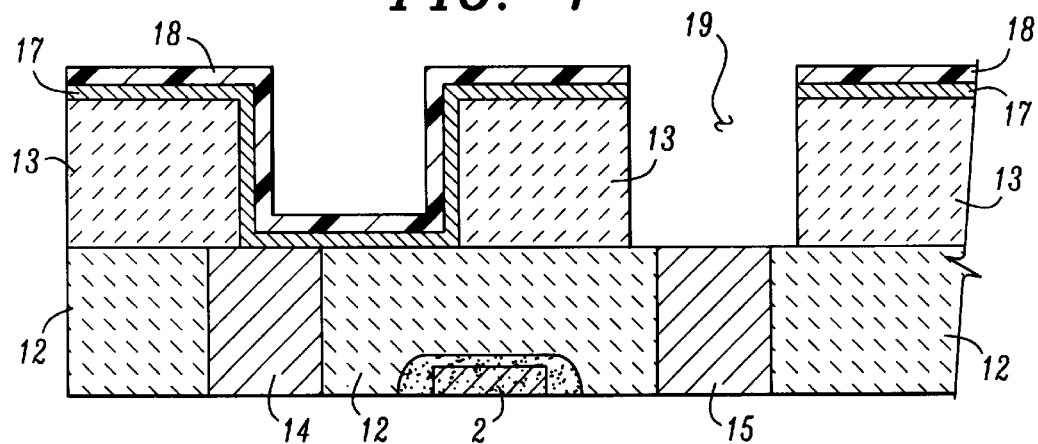
Figure 5:
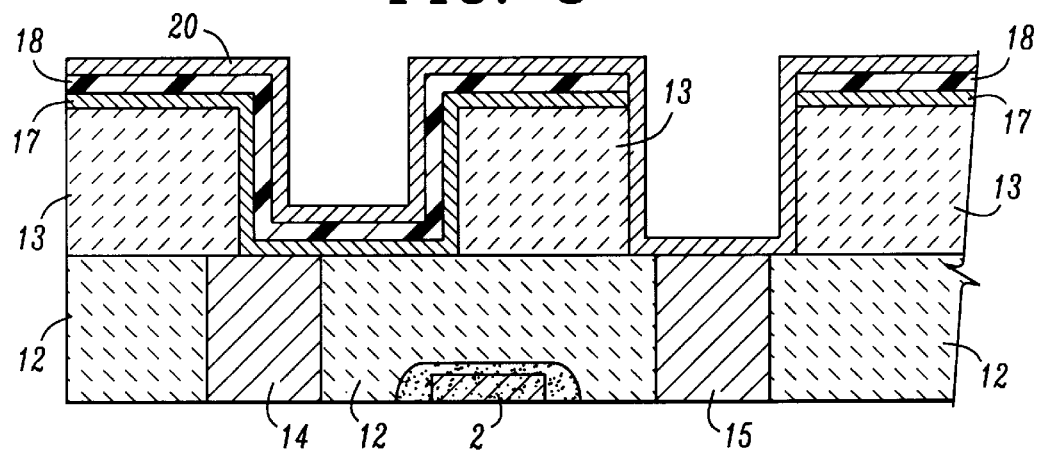

Following the deposition of the high dielectric layer 18, a second trench or well 19 is formed using conventional masking and etching techniques. As shown in FIG. 4, this trench extends from the surface of the device as represented in FIG. 3 down through layer 18, 17 and 13 to plug 15. Subsequent to formation of trench 19, a top capacitor electrode layer 20 is formed over the surface of the device. A top plug layer 21 (see FIG. 6) is then formed over the surface of the device. This plug layer 21 fills the trench 15. The Surface of the device is then removed, such as with chemical mechanical polishing to leave the structure shown in FIG. 7 which shows the DRAM capacitor consisting of dielectric layer 18 between capacitor electrodes or plates 17 and 20. Utilizing one mask, the upper surfaces of both the DRAM capacitor and the plug 21 are metalized and the provided with a protective oxide coating and an be seen with reference to FIG. 8.

Typical thickness' for the various layers of the device shown are from 8000A to 10,000A for the conformal dielectric layer 12, from 10,000A to 12,000A for the top dielectric 13, from 300A to 500A for the lower capacitor electrode layer 17, from 100A to 500A for the high dielectric constant layer 18, and from 300A to 500A for the top electrode 20 of the capacitor.

The various layers of the capacitor, i.e. the capacitor electrodes 17 and 20 and the high dielectric layer 18 can be formed by conventional well known processing techniques. Typically, the will be formed by means of either sputtering or chemical vapor deposition, depending upon the material to be deposited. In general, sputtering offers low temperature processing which is usually preferred in the manufacture of integrated DRAM cells, provided the sputtered film quality is as good as the CVD deposited film for the material employed.

What is claimed is:

1. A DRAM cell comprising a transistor having a gate, a source region and a drain region, a first dielectric layer overlying the transistor gate, source and drain regions, a second dielectric layer overlying the first dielectric layer and a capacitor having a high dielectric layer between a bottom and a top capacitor electrode formed in a first well in the second dielectric layer, the first well at least partially overlying the transistor gate region and making contact with a first conductive plug extending through the first dielectric layer adjacent the transistor gate, and the top capacitor electrode acting as a barrier layer between a second conductive plug extending through the first dielectric layer and a plug in a second well in the second dielectric layer over said second conductive plug.

2. The DRAM cell recited in claim 1 wherein the first and second conductive plug contact the source and drain regions of the transistor.

3. The DRAM cell recited in claim 1 wherein the dielectric constant of the high dielectric layer of the capacitor is at least 20.

4. The DRAM cell recited in claim 3 wherein the high dielectric layer is selected from tantalum oxide and barium strontium titanate.

5. The DRAM cell recited in claim 3 wherein the capacitor electrodes are selected from the group consisting of metals having a high work function, refractory metals, refractory metal suicides, metal nitrides and conductive oxides.

6. The DRAM cell recited in claim 5 wherein the electrodes are selected from Ag, Cu, Au, W, V, Pt, Pd, Ni, Ti, Mo, Ta, Co and their silicides, Ti and Al nitrides, and the oxides of Ru, Ir and SrRu.

* * * * *